United States Patent [19]

Hashimoto

[11] Patent Number: 5,025,324
[45] Date of Patent: Jun. 18, 1991

[54] METHOD OF AND APPARATUS FOR RECORDING INFORMATION ON BOTH A MAIN RECORDING MEDIUM AND AN ENDLESS RECORDING MEDIUM FOR REPEATED EVENT MONITORING

[75] Inventor: Kazuo Hashimoto, Tokyo, Japan

[73] Assignee: Hashimoto Corporation, Tokyo, Japan

[21] Appl. No.: 295,073

[22] Filed: Jan. 9, 1989

Related U.S. Application Data

[63] Continuation-in-part of Ser. No. 773,191, Sep. 6, 1985, abandoned.

[51] Int. Cl.⁵ .......................................... H04N 5/782
[52] U.S. Cl. ...................................... 358/335; 360/5; 360/15; 369/24; 369/84
[58] Field of Search ................ 358/194.1, 335, 908; 369/24, 30, 84; 360/5, 13, 14.1, 14.3, 33.1, 15; 381/110; 364/410

[56] References Cited

U.S. PATENT DOCUMENTS

| | | | |
|---|---|---|---|
| 3,885,090 | 5/1975 | Rosenbaum | 360/5 X |
| 4,281,354 | 7/1981 | Conte | 360/5 |
| 4,321,634 | 3/1982 | Lehureau | . |
| 4,333,152 | 6/1982 | Best | 364/410 X |
| 4,403,318 | 9/1983 | Nagashima et al. | . |
| 4,430,676 | 2/1984 | Johnson | 360/13 |
| 4,450,487 | 5/1984 | Koide | 358/335 |
| 4,513,189 | 4/1985 | Veda et al. | 381/110 X |
| 4,525,820 | 6/1985 | Enoki et al. | 360/33.1 X |
| 4,527,204 | 7/1985 | Kozakai et al. | 360/33.1 |
| 4,569,026 | 2/1986 | Best | 381/110 X |
| 4,593,403 | 6/1986 | Kishi et al. | 381/110 X |

Primary Examiner—Aristotelis M. Psitos
Assistant Examiner—W. R. Young
Attorney, Agent, or Firm—Lowe, Price, LeBlanc, Becker & Shur

[57] ABSTRACT

In an audio/video information recording/playback apparatus with repeating monitor function which includes an endless type recording medium T-1 of about twenty seconds for one cycle and a main recording medium T-2 with tape ends, while both media are driven simultaneously in a recording mode to record broadcasting or other external information, if a viewer wants to repeatedly monitor a part of this information, he can set the T-1 to a repeating playback mode by pushing a playback button of a remote control box and the desired part can be repeatedly played back for repeated monitoring by a TV set. During this playback of T-1, T-2 is continuously driven in the recording mode to continuously keep recording the information. Further, while the viewer is monitoring the playback of the T-2 of a VTR-2 by the TV set, if he wants to repeatedly monitor a part of the playback information, the VTR-2 is stopped by switching to a playback mode the T-1 of a VTR-1 which has already recorded the part of playback of VTR-2, so that this part can be repeatedly played back on VTR-1 for about twenty seconds so as to enable the viewer to learn well the part recorded. When the viewer finishes learning, he pushes a recording button again to switch the VTR-1 to the recording mode again, and then the VTR-2 is driven in the playback mode again from the stopping position. The VTR-1 is continuously driven to record repeatedly the playback information of the VTR-2.

6 Claims, 2 Drawing Sheets

METHOD OF AND APPARATUS FOR RECORDING INFORMATION ON BOTH A MAIN RECORDING MEDIUM AND AN ENDLESS RECORDING MEDIUM FOR REPEATED EVENT MONITORING

This Application is a Continuation-in-part of application Ser. No. 06/773,191, filed Sept. 6, 1985, now abandoned.

BACKGROUND OF THE INVENTION

A recording apparatus with two standard cassette tapes has been used in a conventional telephone answering device for more than ten years. Furthermore, a coplanar type recording apparatus by the same applicant which includes an endless tape and a standard reel-to-reel tape above and below in the case of a cassette tape, wherein the two tapes are separately driven by a common capstan or separate rollers, has been known.

The present invention is proposed to use such apparatus for a different purpose.

SUMMARY OF THE INVENTION

It is an object of the present invention to provide an audio/video information recording/playback apparatus, wherein during continuous recording of broadcasting or other external information on a main video tape of a VTR, if a viewer wants to repeatedly monitor a part of these information, he can play back and monitor it by operating another tape of the VTR without interfering with the recording operation of the main tape, and the continuous recording of the main tape can be performed during repeated monitoring.

It is another object of the present invention to provide an audio/video information recording/playback apparatus wherein while the VTR-2 of a main video tape for continuous operating is played back and a viewer is monitoring its playback by a TV set, if the viewer wants to repeatedly monitor a part of its playback (for about twenty seconds), the VTR-2 is stopped in response to switching to a playback mode a VTR-1 which has already driven an endless tape T-1 repeatedly in a recording mode; this part is repeatedly played back on the VTR-1 for about twenty seconds to make the viewer learn the content of T-2 well. When the viewer finishes learning and pushes a recording button of the VTR-1 again, VTR-2 is driven in the playback mode again from said stopping position and the VTR-1 continues to repeatedly record the playback of VTR-2.

The above and other objects, features and advantages of the present invention will become more apparent from the following description when taken in conjunction with the accompanying drawings in which preferred embodiments of the present invention is shown by way of illustrative example.

BEST MODE FOR PRACTICING THE INVENTION

Figure 1:
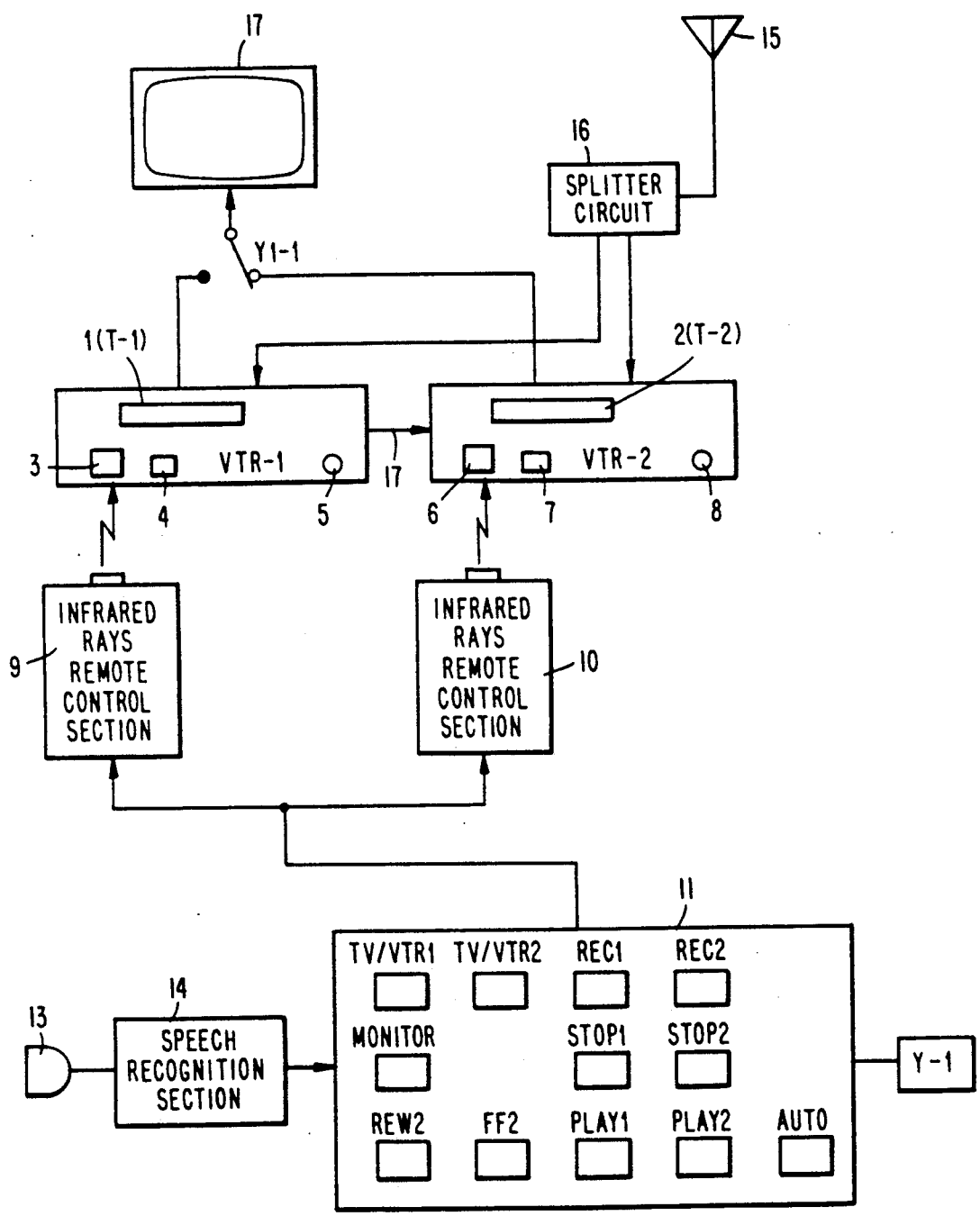
FIG. 1 is a block diagram which shows the principle of a preferred embodiment of the invention.

The first preferred embodiment of the invention will be described as follows. In FIG. 1, reference numeral 1 denotes an endless tape having a length such that it takes about 20-60 seconds to complete one revolution. Reference numeral 2 denotes a main cassette type tape of a reel to reel style. This device can use a cassette tape unit which records sound or which records the video.

The above two tapes (which mean the endless tape 1 and the cassette type tape 2) are set to the recording operation at the same time. In the process in which recording is carried on the main tape with watching/listening to the program which has been recorded, when there is a part of the program which an operator hopes to record or the operator hopes to watch/listen to, only the endless tape is set to the playback condition. As a result, the operator can play back and confirm the contents of the program part by repeating that part. Alternatively, the operator can continue to record the sound and/or the video without interruption or hindrance on the main recording operation by inserting the other endless tape to the VCR, after the used endless tape is picked up from the VCR without playback. When the main tape is driven in the playback condition, the part of the contents is recorded on the endless tape. As a result, it is possible to play back repeatedly the part of the contents recorded on the endless tape. In order to practice the above operation, the invention has the construction as follows. Reference symbol VCR-1 denotes a video cassette recorder which is on the market for driving the endless tape. Reference symbol VCR-2 denotes a video cassette recorder which is on the market for driving the reel-to-reel unit 1. In the VCR-1 and the VCR-2, reference numerals 3 and 6 denote photo detectors which receive coded infrared rays from infrared remote control sections 9 and 10, which will be described later. Reference numeral 4 and 7 denote buttons for ejection of the tape T-1 and the tape T-2, described above. Reference numerals 5 and 8 denote monitor jacks for earphones (not shown in the drawings).

Reference numerals 9 and 10 denote wireless infrared remote control sections for the VCR-1 and the VCR-2, and have buttons for switching the channel, buttons for playing back, buttons for recording, buttons for stopping, buttons for rewinding, and buttons for forwarding, etc., which are all known well. A button terminal corresponding to each operation is short-circuited by a switching transistor (not shown in the drawings) in accordance with a signal from a lumped control section 11, having a single chip CPU (central processing unit) which sets the program. The VCR-1 and the VCR-2 are usually controlled through the lumped control section 11.

In the lumped control section 11, reference symbol REC 1 denotes a button for recording on the VCR-1, reference symbol REC 2 denotes a button for recording on the VCR-2, reference symbol STOP 1 denotes a button for stopping the VCR-1, and reference symbol PLAY 1 denotes a button for playing back on the VCR-1. Reference symbol STOP 2 denotes a button for stopping the VCR-2, reference symbol FF 2 denotes a button for forwarding, reference symbol REW 2 denotes a button for rewinding, and reference symbol PLAY 2 denotes a button for playing back on the VCR-2. Reference symbol TV/VCR 1 and TV/VCR 2 denote buttons for switching an input from each television set and each VCR. Reference symbol MONITOR denotes a button for switching a monitor television set 17, described later, to the VCR-1 side or the VCR-2 side by a relay Y-1 linked with the button MONITOR.

When each button on the VCR-1 is pushed, a control signal is applied to the infrared remote control section 9. As a result, the infrared remote control section 9 outputs the coded corresponding infrared rays, and the VCR is controlled. When each button on the VCR-2 is pushed, the VCR-2 is controlled through the infrared remote control section 10. Accordingly, it is possible to operate together and efficiently the device without touching the VCR-1 and the VCR-2, except for taking in and out the tape, by operating the lumped control section.

Reference symbol Y-1 denotes a relay which is linked with the monitor button and the timer. The relay Y-1 switches the input of the video signal to the monitor television set 17, which will be described later. Reference numeral 13 denotes a microphone. Reference numeral 14 denotes a speech recognition section. The name of each button on the lumped control section 11 can be input by voice. Accordingly, the operator can concentrate on the monitor of the monitor television set 17 without pushing each button for operating.

Reference numeral 15 denotes an antenna, and reference numeral 16 denotes a splitter circuit. The output from the splitter circuit 16 is applied to the VCR-1 and the VCR-2. Reference numeral 17 denotes a monitor television set.

The monitor television set 17 always monitors the signal from the antenna 15 and the splitter circuit 16. When the relay Y-1 is set to ON, the monitor television set can monitor the signal played back from the endless tape T-1 of the VCR-1 side.

This device is made of the above elements, and the operation of the device will now be described concretely in accordance with the first preferred embodiment. The endless tape T-1 has already been set to the VCR-1 side, and the tape T-2 has already been set to the VCR-2 side. When the button REC 1 and the button REC 2 of the lumped control section 11 are pushed, a switching transistor (not shown in the drawings) in the lumped control section 11 is set to ON. As a result, the terminals of the button for recording (not shown in the drawings) of the infrared remote control section 9 and 10 are short-circuited, the coded infrared rays for recording are output, the output infrared rays are input to the VCR-1 and the VCR-2 through photo detector 3 and photo detector 6, and the tape T-1 and the tape T-2 are set to the recording condition. Accordingly, the video signal and the sound signal of high frequency are input through the antenna 15 and the splitter circuit 16.

Monitored information of traffic in a main traffic network, for example, may be recorded on the tape T-1 and the tape T-2 at the same time through VCR-1 and VCR-2 At this time, when the tape T-1 is a 60 second endless tape, information recorded in succession on the tape T-1, changes to new information each 60 second intervals of time. In other words, the information recorded on the tape T-1 is stored for 60 seconds. Accordingly, in a case where a traffic accident occurs for example, when the circumstance is confirmed by the monitor television set 17, and the operator hopes to store the circumstance as a file on the endless tape T-1, or the operator hopes to confirm the circumstance again, the operator stops the endless tape T-1 by pushing the button STOP 1, and can pick up the endless tape T-1 by pushing the button for ejection. After the operator picks up the endless tape T-1, the operator sets a new endless tape T-1 in the VCR-1 and pushes the button REC 1. And when the operator hopes to confirm the contents recorded on the endless tape T-1, the operator pushes the button PLAY 1. As a result, the VCR-1 is switched to the playback condition through the infrared remote control section.

At the same time, a flip-flop (not shown in the drawings) in the lumped control section 11, is set. The output from the flip-flop keeps the relay Y-1 in the operation condition. As a result, the monitor television set 17 is switched from the VCR-2 side to the VCR-1 side by setting contacts y1-1 to the left side in FIG. 1. And when confirmation of the endless tape T-1 is finished, the button STOP 1 is pushed. At this time, the flip flop is reset, the relay Y-1 is restored, and the monitor television set 17 is reset to the VCR-2 side.

When the tape is exchanged to a new tape or the button REC 1 is pushed in the condition where the tape which has been used in the VCR-1 is set in accordance with such circumstance after the content of the recording is confirmed, the VCR-1 is switched to the recording operation, which has been already explained above. The recording operation by the VCR-2 is continued while exchanging the endless tape T-1 or while confirming the content of the endless tape T-1, as explained above. Accordingly, the information is not missed. However, the monitor television set 17 is switched to the VCR-1 side, when the contents recorded on the endless tape T-1 is confirmed as above. As a result, the VCR-2 cannot be monitored during the above operation. This problem will be solved by increasing the monitor television set as occasion calls.

On the other hand, when the operator hopes to record the part of the contents recorded on the tape T-2 in the VCR-2 on the endless tape T-1 in the VCR-1, the button TV/VCR 2 is pushed, and the input to the VCR-1 is switched to the condition where the video of the VCR-2 can b input. In this condition, it is possible to dub by switching the device to playback of the tape T-2 and pushing the button REC 1, which has been already explained above, after the corresponding part which the operator hopes to dub is picked up in the tape T-2 by practicing specific operations, i.e., rewinding, forwarding, and playback of the tape T-2.

As in the above explanation, the content dubbed on the endless tape T-1 is played back by pushing the button PLAY 1. At this time, the monitor television set 17 is switched to the VCR-2 side, and it is possible to practice the above operation by pushing the button MONITOR and switching the contacts y1-1 of the relay Y-1 to the VCR-1 side.

In this application, two infrared remote control sections 9 and 10 and the lumped control means of the two infrared remote control sections 9 and 10 are described separately, and only one television set is described in FIG. 1. However, in another preferred embodiment of this invention, it is possible to unify the VCR-1 and the VCR-2, and it is possible to unify the infrared rays remote control section 9 and the infrared rays remote control section 10, or it is possible to unify the whole system. The above kinds of arrangement can be practiced by requests of customers in the market, and are included within the scope of the inventive concept as a matter of course.

Figure 2:
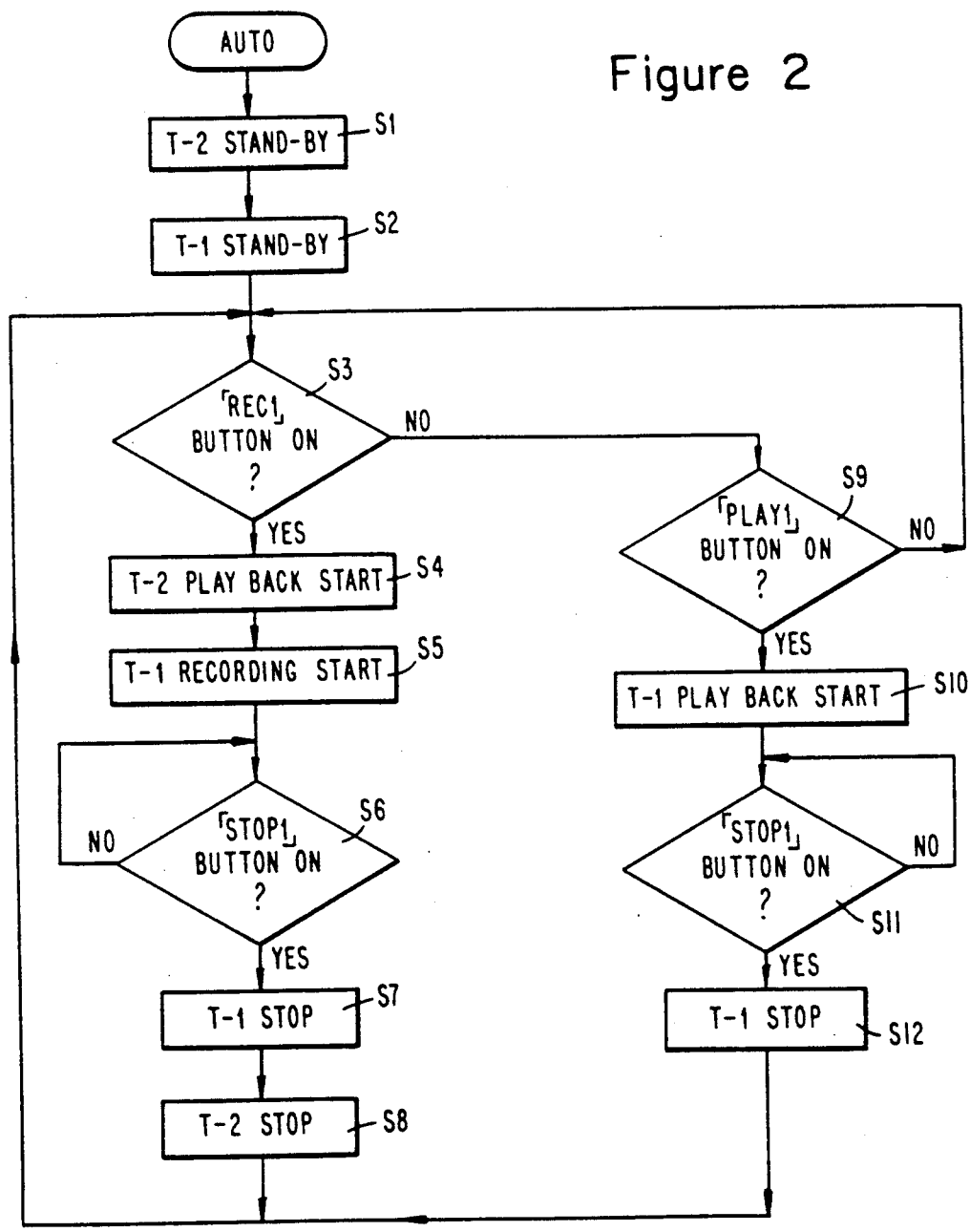
FIG. 2 is a flow chart which shows a second preferred embodiment of the invention.

The second preferred embodiment which automates the above operation will be described with reference to the flow chart of FIG. 2 in detail. When the beginning point of the tape T-2 which the operator hopes to dub is set, the button AUTO in FIG. 1 is pushed. The routine of AUTO in FIG. 2 is called by pushing the button AUTO. In step S1, the tape T-2 is set to the stand-by mode, i.e., the condition wherein the tape stops in the condition wherein the tape is wound in a rotating head (loading condition). It is possible to set the above stand-by mode by outputting the command of the playback and the command of the temporary stop to the VCR-2.

In step S2, the endless tape T-1 as well as the tape T-2 is set to the stand-by mode. When the dubbing, described later, is practiced automatically, a gap of the timing between the tape T-1 and the tape T-2 is prevented from occurring, and unnecessary time of about three seconds for the loading is saved by setting the tape T-2 and the endless tape T-1 to the stand-by mode.

In step S3, a test whether the button REC 1 is pushed or not is made. When the button REC 1 is pushed, the program is advanced to step S4 and the tape T-2 is started in the playback condition. The endless tape T-1 is then started in the recording condition (step S5). Accordingly, the contents recorded on the tape T-2 is dubbed on the endless tape T-1.

In step S6, a test whether the button STOP 1 for stopping is pushed or not is carried out. The program is advanced to step S7 and step S8 by pushing the button STOP 1, and the endless tape T-1 and tape T-2 are stopped (the condition of the temporary stop). It is possible to stop tape T-2 by the manual operation, and when tape T-2 is stopped by the manual operation, automatic control can omit the operation which stops tape T-2.

The condition of dubbing is monitored by the monitor television set 17; accordingly, when the operator hopes to stop endless tape T-1 and tape T-2, the button STOP 1 is pushed as occasion calls. When the operator hopes to watch the contents dubbed on the endless tape T-1 as above, the operator pushes the button PLAY 1. As a result, step S9 becomes affirmative.

In step 10, playback of the endless tape T-1 is started. And, when the button STOP 1 is pushed after the content of the recording is confirmed, the program is advanced to step 812 and stops the endless tape T-1. When the operator hopes to dub the next content of the tape T-2 to the endless tape T-1, after finishing watching the endless tape T-1, this operation is practiced by pushing only the button REC 1 through steps S3–S8 as above.

In the general VCR, the above stand-by mode (temporary stop) is released by continuing the condition of the stand-by for about 7 minutes, the tape is released from the rotating head (the release of loading), and the stand-by mode is switched to the stop mode. Accordingly, when watching the endless tape T-1 is repeated and about 7 minutes passes, loading of the tape T-2 is released. It takes about 3 seconds to practice another loading; accordingly, when 7 minutes passes, this invention sets the timing for the next dubbing by releasing the loading of the tape when the endless tape stops (this operation is not described in the drawings). It is possible to switch the monitor television set from the VCR-1 side to the VCR-2 side automatically by pushing the button PLAY 1. It is also possible to switch, at will, the monitor television set to the VCR-1 side and the VCR-2 side by pushing the button MONITOR (the above two operations are not described in the drawings).

In this invention as above, when the operator hopes to record a specific part of video or music in a process wherein video or music is recorded while watching the video or listening to the music, it is possible to record the specific part by exchanging the endless tape, which is driven with the main tape after the endless tape that has already been set in the VCR is picked up. Alternatively, it is possible to record continuously on the endless tape video or music which is input from the outside while recording the video or the music on the main tape by keeping the recording condition, when the operator judges that it is not necessary to record the specific part after the operator confirms the specific part by setting only the endless tape to the playback condition for 20 seconds-30 seconds. For example, when traffic is monitored in an area where there is much traffic, or when it is necessary to monitor a scientific matter, this invention can be used effectively. When a traffic accident occurs for example, the operator can confirm at once the several seconds from the condition before the traffic accident occurs to the condition after the traffic accident occurs. When the operator judges that the traffic accident is not important after confirming the above condition, the device is set to the recording condition. And when the operator judges that the traffic accident is important and necessary to be stored, the endless tape on which the traffic accident is recorded is exchanged with another endless tape, and the recording operation is continued again. In exchanging the endless tape which was used with another endless tape, the main tape is continuously and smoothly maintained in the recording condition without hindrance. As a result, this invention can be used effectively for various purposes including a monitor system.

The foregoing description of the preferred embodiment of the invention has been presented for purposes of illustration and description and is not intended to be exhaustive or to limit the invention to the precise forms disclosed, since many modifications and variations are possible in light of the above teaching. The embodiment was chosen and described in order best to explain the principles of the invention and its practical application, thereby to enable others skilled in the art best to utilize the invention in various embodiments and with various modifications as are suited to the particular use contemplated therefor. It is intended that the scope of the invention be defined by the claims appended hereto, when interpreted in accordance with full breadth to which they are legally and equitably entitled.

What is claimed is:

1. An audio/video information recording/playback apparatus with repeating monitor function and having an input means for receiving broadcast information, comprising:
    means for performing a repeating recording operation of an endless type recording medium (T-1) which is composed of at least several seconds per cycle, and for performing a repeating playback operation thereof selectively in response to a control signal;
    means for performing a recording or playback operation of a main recording medium (T-2);
    means responsive to a first control signal generated by a remote control box for driving both said recording media (T-1 and T-2) simultaneously in a recording mode; and
    control circuit means including
        (a) first means operative in a first mode that is responsive to a second control signal generated by said remote control box for recording on said main recording medium (T-2) broadcast information received at said input means while causing a repeating playback of said endless type recording medium (T-1) so as to keep recording said broadcast information on said main recording medium (T-2) without interruption; and (b) second means operative in a second mode that is
  (i) responsive to a third control signal generated by said remote control box for starting playback of said main recording medium (T-2) and, at the same time, setting said endless type recording medium (T-1) in the recording mode while said main recording medium (T-2) is used for playback so that information previously recorded by said main recording medium (T-2) can be recorded by said endless type recording medium (T-1),
  (ii) responsive to a fourth control signal generated by said control box for causing temporary stopping of a driving operation of said main recording medium (T-2) at a temporary stopping position thereof while causing a repeating playback of said endless type recording medium (T-1), and
  (iii) responsive to a fifth control signal generated by said remote control box for performing a playback operation of said main recording medium (T-2) from said temporary stopping position and at the same time switching said endless type recording medium (T-1) to the recording mode to record information previously recorded on said main recording medium (T-2).

2. An audio/video information recording/playback apparatus with repeating monitor function of claim 1, wherein said means for performing recording and playback operations on said endless type recording medium (T-1) and said main recording medium (T-2) comprise, respectively, first and second video tape recorders.

3. An audio video information recording/playback apparatus with repeating monitor function of claim 1, including a relay wherein broadcast information recorded on the endless type and main recording media can be selectively viewed on a television set by controlling said relay.

4. An audio video information recording/playback apparatus with repeating monitor function of claim 1, wherein the remote control box generates infrared rays.

5. An audio video information recording/playback apparatus with repeating monitor function of claim 4, wherein audio information for controlling said remote control box can be input separately through a microphone.

6. An audio video information recording/playback apparatus with repeating monitor function of claim 1, wherein video broadcast information is received by an antenna, the apparatus including a splitter for splitting the information to be received by the endless type and main recording media.

* * * * *